United States Patent [19]

Ludington

[11] 4,326,269
[45] Apr. 20, 1982

[54] ONE BIT MEMORY FOR BIPOLAR SIGNALS

[75] Inventor: David N. Ludington, New Hartford, N.Y.

[73] Assignee: General Electric Company, Utica, N.Y.

[21] Appl. No.: 157,756

[22] Filed: Jun. 9, 1980

[51] Int. Cl.³ .............................................. G11C 11/40
[52] U.S. Cl. ...................................... 365/189; 365/207
[58] Field of Search ............... 307/221 D; 340/146.1; 365/189, 202, 207

[56] References Cited

U.S. PATENT DOCUMENTS

| | | | |
|---|---|---|---|
| 3,479,528 | 11/1969 | Fisher | 307/231 |
| 3,819,953 | 6/1974 | Puckette | 307/221 D |
| 3,969,677 | 7/1976 | Woyton | 328/140 |
| 3,991,409 | 11/1976 | Dautremont, Jr. et al. | 365/73 |
| 4,078,204 | 3/1978 | Gauthier | 328/21 |
| 4,078,225 | 3/1978 | Jessop | 340/146.1 |

*Primary Examiner*—Terrell W. Fears
*Attorney, Agent, or Firm*—Ralph M. Savage

[57] ABSTRACT

A one bit memory for bipolar signals is disclosed comprising one channel which samples the positive portion of an input signal and another channel which samples the negative portion of the input signal. Having stored a one bit sample in a separate shift register for each channel, the three level output signal is obtained by combining the outputs of each shift register.

2 Claims, 6 Drawing Figures

ONE BIT MEMORY FOR BIPOLAR SIGNALS

FIELD OF THE INVENTION

This invention relates generally to the sampling and storage of electrical signals, and more particularly to the sampling and storage of bipolar signals.

DESCRIPTION OF THE PRIOR ART

Conventional circuits for the binary storage of analog signals have utilized a one bit representative of an input signal by thresholding the input signal into two levels and then storing digital samples of this approximation. FIGS. 1 and 2 respectively illustrate a block diagram and typical waveforms for this technique.

The input analog signal is thresholded by comparator 2 and then stored in shift register 4. The accuracy with which the stored samples represent the comparator output is determined by the frequency of clock 6, i.e., the faster the clock the better the accuracy. If the clock is turned off, the signal present in shift register 4 can be stored indefinitely.

The inherent limitation in the circuit shown in FIG. 1 is that this method results in considerable distortion for certain types of input signals. The problem is that bipolar signals are converted to unipolar signals as shown in FIG. 2. This results from the fact that there are only two output levels of the shift register and thus the no signal condition cannot be distinguished from the condition when the signal is negative. For some signals this is immaterial, while for others the resultant dc bias and loss of information cannot be tolerated.

Accordingly, it is an object of the present invention to provide a one bit memory for bipolar signals that can overcome the aforementioned shortcomings of the prior art. More specifically, it is an object to provide a circuit that can distinguish a zero level input signal from one that has a negative level.

It is a further object to provide a circuit that can eliminate the necessity for an analog digital converter thereby realizing significant hardware savings and also much higher speeds.

An additional object is to provide a low cost circuit that is small in size and weight, is composed of off the shelf components, and has high reliability.

These and other objects of the present invention will become more fully apparent with reference to the following specification and drawings which relate to a preferred embodiment of the invention.

BRIEF DESCRIPTION OF THE DRAWINGS

The invention, together with further advantageous features thereof, will be better understood upon study of the following, more detailed specifications of which the appended claims, abstract and accompanying drawings, form a part, when considered together with these accompanying drawings, in which:

SUMMARY OF THE INVENTION

The one bit memory for bipolar signals of the present invention comprises two parallel channels, one responsible for the one bit quantization of the positive portion of the input signal and the other responsible for the one bit quantization of the negative portion of the input signal. Each channel consists of a comparator which thresholds the input signal and a shift register which stores the one bit binary representation of each sampled signal.

An operational amplifier is utilized to combine the outputs of the two shift registers so that a three level output signal can be obtained.

DESCRIPTION OF THE PREFERRED EMBODIMENT

Figure 1:
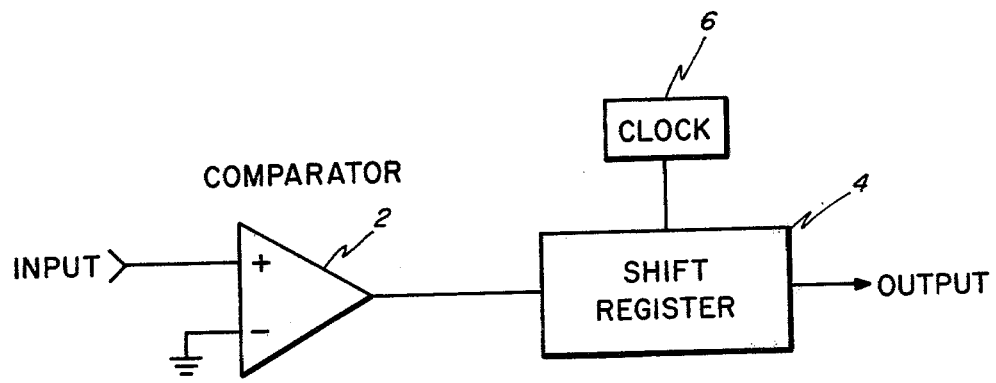
FIG. 1 is a block diagram of a prior art circuit which would quantize an input signal into one of two different levels.
Figure 2:
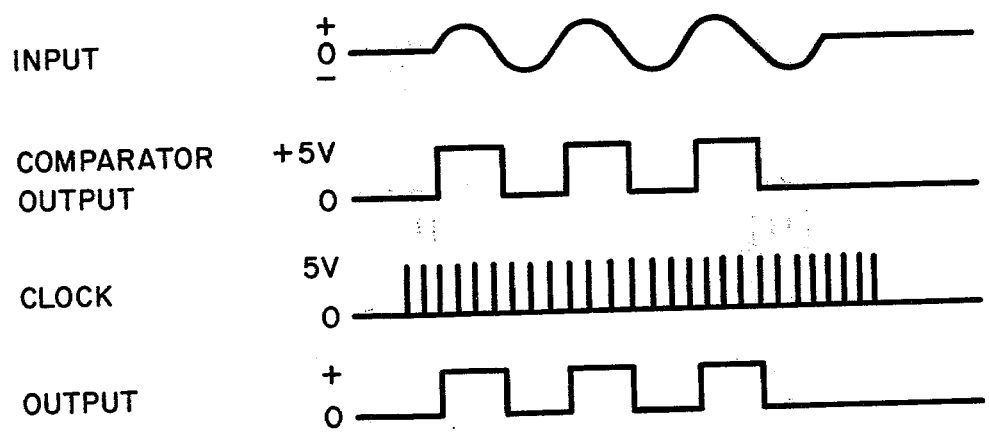
FIG. 2 includes waveforms for the block diagram shown in FIG. 1.
Figure 3:
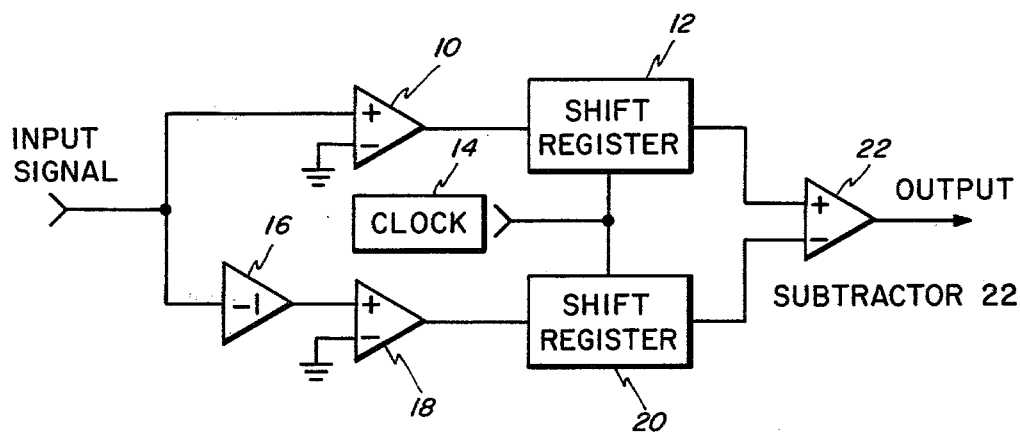
FIG. 3 is a block diagram of the present invention.
Figure 4:
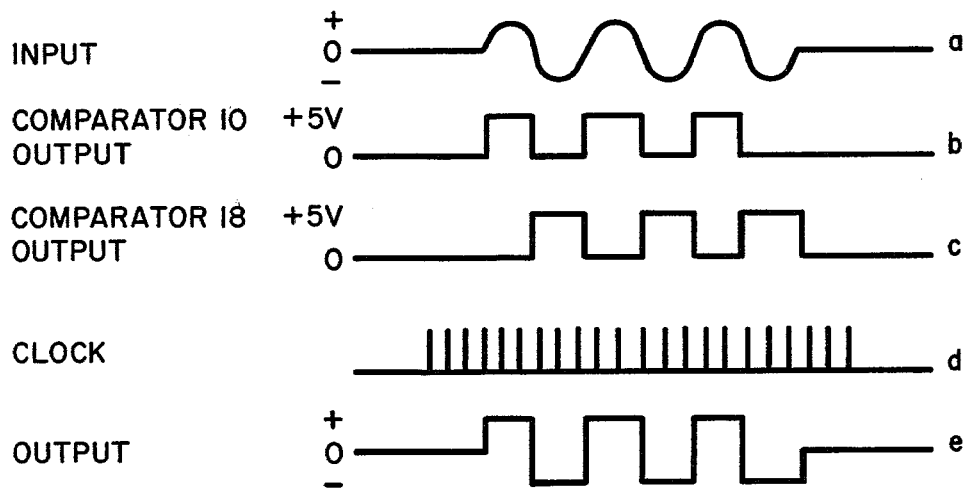
FIG. 4 includes waveforms and selected points within the instant invention.

Referring now to the drawings, and more specifically to FIG. 3, thereof, there is shown generally the one bit memory for bipolar signals which is the subject matter of the instant invention. Comparator 10 and shift register 12 are utilized to store the positive portion of the signal, and inverter 16, comparator 18 and shift register 20 are utilized to store the negative portion of the input signal. As shown in FIG. 4b, the output of comparator 10 will be a high level when the input signal is positive and will be a low level when the input signal is 0 or negative. Inverter 16 causes any negative portion of the input signal to appear as a positive signal so that comparator 18 and shift register 20 can operate in an analogus manner as comparator 10 and shift register 12. Subtractor 22 serves to combine the positive and negative portions of the input signal thereby achieving the desired bipolar signal.

The ability of the present invention to store a bipolar signal as one bit samples and achieve a three level output, retains the frequency information of input signals because 0 crossing information is retained. Although detailed amplitude information is lost, for many applications, this is not significant.

Figure 5:
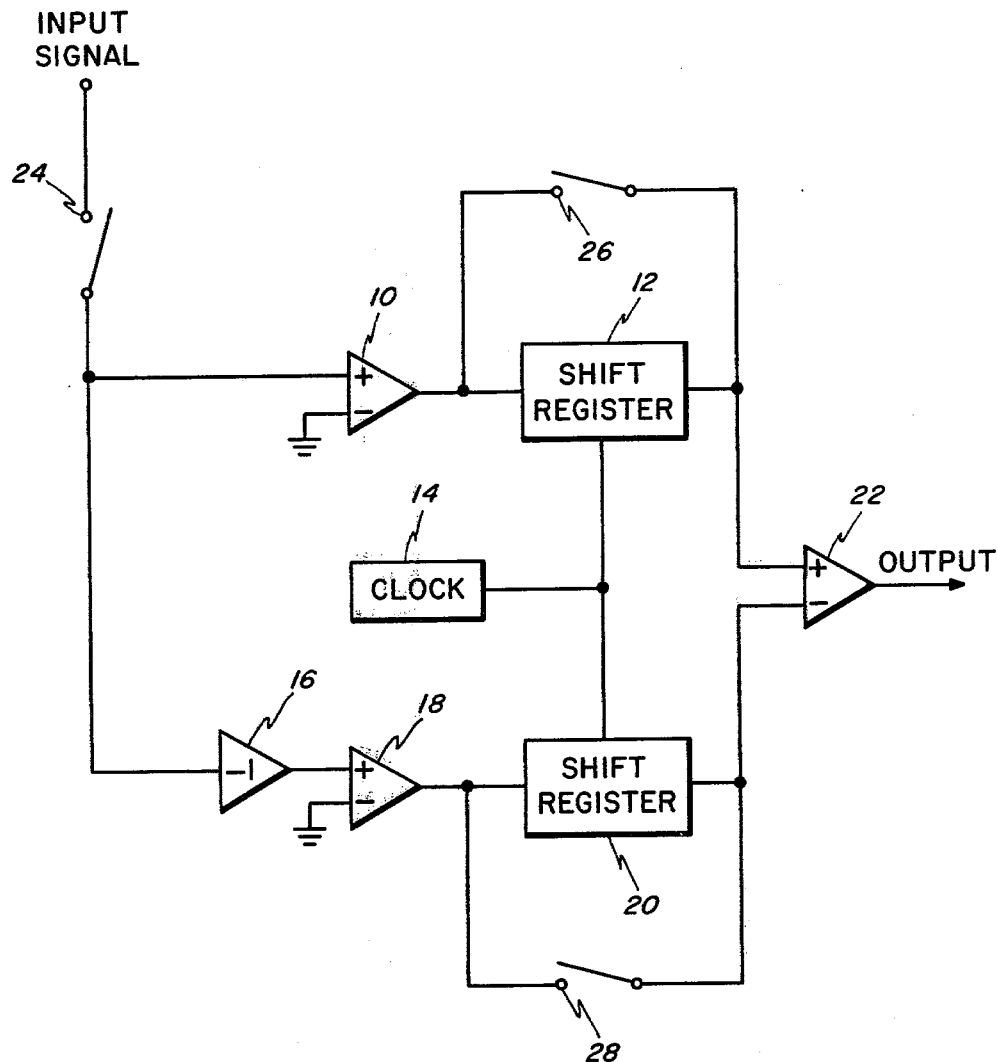
FIG. 5 presents a block diagram for a switching arrangement in combination with the invention illustrated in FIG. 3 which would allow input signals to be retained indefinitely.

In certain applications such as electronic countermeasures or coded communication systems, it may be desireable not to continuously sample an input signal. FIG. 5 represents such a mode of operation in which switch 24 would open after samples of a desired signal are retained in shift registers 12 and 20. By closing switches 26 and 28, the samples of the desired signal can be recirculated in shift registers 12 and 20 for an indefinite amount of time.

Figure 6:
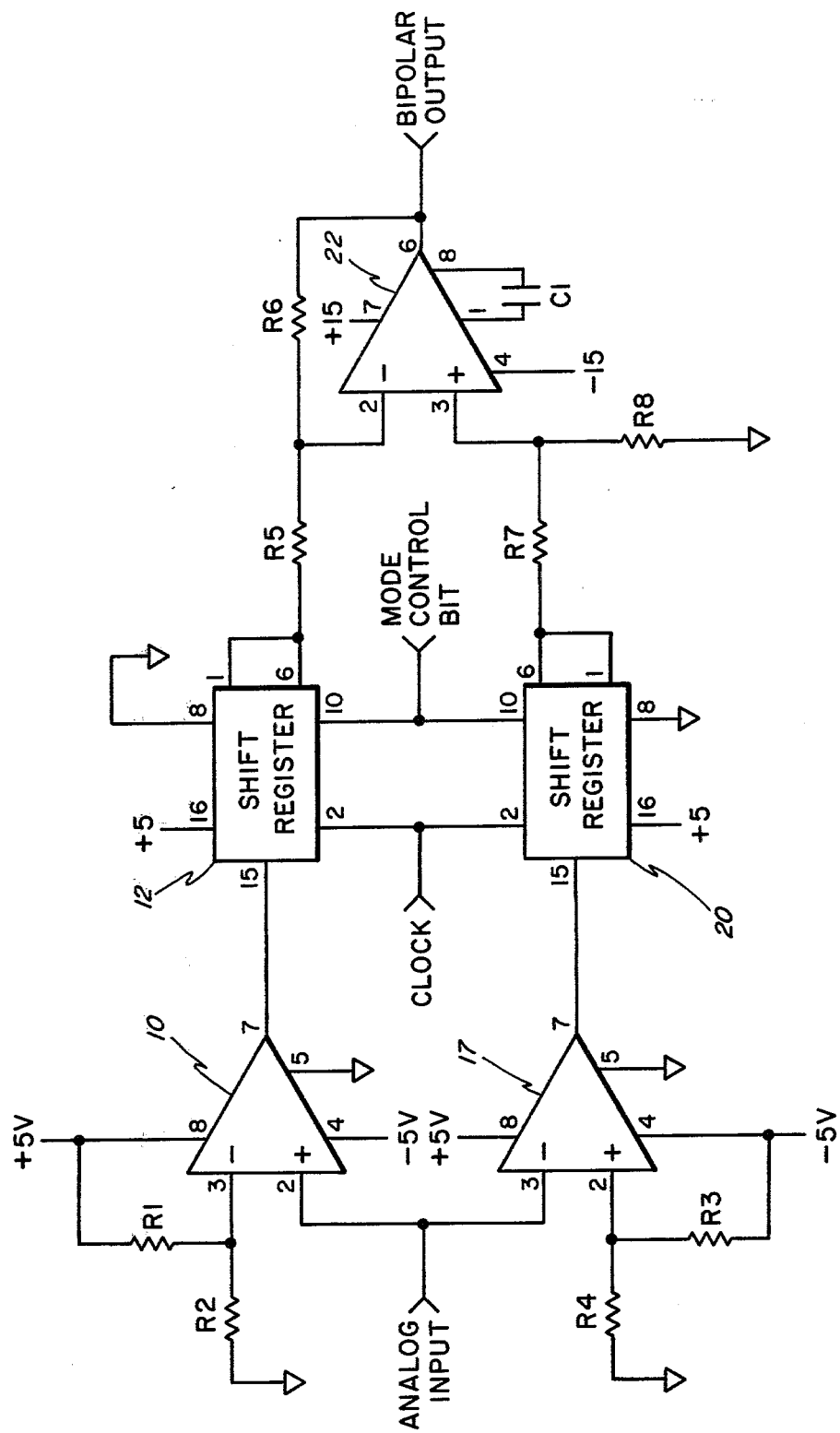
FIG. 6 presents a schematic diagram of the instant invention.

FIG. 6 is a schematic diagram of the "in phase" or "quadrature" channel of the one bit memory for bipolar signals. Since the "in phase" and "quadrature" channels are identical, only one of the channels is illustrated in FIG. 6. Integrated circuits 10 and 17 are comparators which threshold the analog input. the signal inversion which is used to store the negative portion of the signal is accomplished by using the negative input of comparator 17 for the input. In order to insure that with the input signal at zero the output will be zero, the threshold is not set at zero but at a small positive valve for comparator 10 (determined by resistors R1 and R2) and a small negative value for comparator 17 (determined by resistors R3 and R4). This deadband is typically plus or minus 10 to 20 millivolts. The output of comparators 10 and 17 are sampled by shift registers 12 and 20 respectively. Operational amplifier 22 is used to subtract the output of the shift registers. Resistors R5–R8 determine the relative gain between the negative and positive inputs while C1 is a compensating capacitor.

Comparators 10 and 17 can be realized by Fairchild's as A760, shift registers 12 and 20 by National Semiconductor's CD4031, and operational amplifier 22 by RCA's CA3100. The switching arrangement shown in FIG. 5 can be accomplished by interconnecting the 64 bit National Semiconductor's shift registers as shown in FIG. 6. If recirculation of the shift register contents is desired, the mode control bit should be a 1. If no recirculation is desired the mode control bit should be a 0.

It should be understood that the one bit memory for bipolar signals of the present invention may be modified as would occur to one of ordinary skill in the art without departing from the spirit and scope of the present invention.

I claim:

1. A one bit memory for a plurality of samples of a bipolar input signal comprising:
   (a) a first channel having a first comparator means and a first shift register means to quantize the positive portion of said input signal into a single positive level and store them;
   (b) a second channel having an inverter, a second comparator means and a second shift register means to invert and quantize the negative portion of the input signal into a single positive level and store them;
   (c) means for substracting the output levels of said second channel from the output levels of said first channel to yield a bipolar output signal having a single quantized positive level corresponding to the positive portion of said input signal and a single quatized negative level corresponding to the negative portion of said input signal whereby the level of said output signal is zero in the absence of said input signal;
   (d) a clock to provide timing pulses to said first and second shift register means.

2. The one bit memory for bipolar input signals described in claim 1 further comprising:
   switching means that would allow a plurality of said samples to be recirculated within said first and second shift registers until their retention is no longer necessary.

* * * * *